US012675798B2

(12) United States Patent
Hayes et al.

(10) Patent No.: US 12,675,798 B2
(45) Date of Patent: Jul. 7, 2026

(54) SYSTEMS, METHODS, AND DEVICES FOR GREENHOUSE GAS MONITORING AND CONTROL

(71) Applicant: Allstate Insurance Company, Northbrook, IL (US)

(72) Inventors: Howard Hayes, Glencoe, IL (US); Timothy W. Gibson, Barrington, IL (US); Peter Bouchard, Chicago, IL (US); Thomas J. Wilson, Chicago, IL (US); Stella YuJen Liu, Chicago, IL (US)

( * ) Notice: Subject to any disclaimer, the term of this patent is extended or adjusted under 35 U.S.C. 154(b) by 0 days.

(21) Appl. No.: 18/371,674

(22) Filed: Sep. 22, 2023

(65) Prior Publication Data

US 2025/0104090 A1 Mar. 27, 2025

(51) Int. Cl.
| *G06Q 30/00* | (2023.01) |
| *G01R 21/133* | (2006.01) |
| *G06Q 30/018* | (2023.01) |
| *G06Q 30/0207* | (2023.01) |

(52) U.S. Cl.
CPC ....... *G06Q 30/018* (2013.01); *G01R 21/1333* (2013.01); *G06Q 30/0207* (2013.01)

(58) Field of Classification Search
None
See application file for complete search history.

(56) References Cited

U.S. PATENT DOCUMENTS

| | | | |
|---|---|---|---|
| 2009/0304101 A1* | 12/2009 | LoPorto | H04L 27/2626 455/70 |
| 2010/0094470 A1* | 4/2010 | Besore | H02J 13/00004 700/282 |
| 2013/0204471 A1* | 8/2013 | O'Connell | B60L 53/68 701/22 |
| 2015/0268281 A1* | 9/2015 | Haghighat-Kashani | G06Q 30/0267 702/62 |
| 2015/0354982 A1 | 12/2015 | Fawaz et al. | |
| 2016/0224987 A1* | 8/2016 | Hersh | G06Q 30/0204 |
| 2019/0372345 A1* | 12/2019 | Bain | H02J 3/008 |
| 2020/0031371 A1* | 1/2020 | Soliman | B60W 10/04 |
| 2023/0136848 A1* | 5/2023 | Kang | B60L 53/66 701/29.4 |

(Continued)

*Primary Examiner* — Christopher Stroud

(57) ABSTRACT

Implementations described herein provide systems, methods, and devices for greenhouse gas monitoring and control. The systems, methods, and devices include a device detection system which identifies device identifier(s) corresponding to device(s) associated with a user. The device(s) include at least one of an electric vehicle, a home device, a power system device, or a power system device. Upon detecting the device(s), a user behavior analyzer receives energy consumption-related data from the device(s) resulting from energy consumption behavior of the user. The system determines, based on the energy consumption-related data, one or more behavior metrics of the user. A reduction integration generator identifies an energy consumption reduction integration corresponding to the one or more behavior metrics (e.g., a device operational parameter modification, a behavioral modification, a credit, and so forth), and integrates the energy consumption reduction integration to facilitate a reduction of energy consumption for the user.

15 Claims, 7 Drawing Sheets

(56) References Cited

U.S. PATENT DOCUMENTS

| | | | |
|---|---|---|---|
| 2023/0139003 A1* | 5/2023 | Bhasme | ................. B60L 58/16 |
| | | | 701/533 |
| 2024/0067031 A1* | 2/2024 | Meroux | ................. G06N 20/00 |

* cited by examiner

124

120

203

205

404

102

400

DEVICE CONTROL SYSTEM
138

POLICY INTEGRATION ENGINE
402

GREENHOUSE GAS USAGE
REPORT GENERATOR
140

MANUAL INPUT
207

USER INTERFACE
121

BEHAVIOR RECOMMENDATION
ENGINE
134

POLICY RULE CRAWLER
136

REDUCTION INTEGRATION GENERATOR 118

700

IDENTIFYING, USING NON-TRANSITORY STORAGE MEDIA STORING COMPUTER-READABLE INSTRUCTIONS EXECUTABLE BY ONE OR MORE PROCESSOR, ONE OR MORE DEVICE IDENTIFIERS CORRESPONDING TO ONE OR MORE DEVICES ASSOCIATED WITH A USER ⟋ 702

STORING THE ONE OR MORE DEVICE IDENTIFIERS IN ONE OR MORE DATABASES ⟋ 704

RECEIVING, USING THE ONE OR MORE PROCESSOR ACCESSING THE ONE OR MORE DEVICE IDENTIFIERS, ENERGY CONSUMPTION-RELATED DATA FROM THE ONE OR MORE DEVICES RESULTING FROM AN ENERGY CONSUMPTION BEHAVIOR OF THE USER ⟋ 706

DETERMINING, USING THE ONE OR MORE PROCESSOR AND THE ENERGY CONSUMPTION-RELATED DATA, ONE OR MORE BEHAVIOR METRICS INDICATIVE OF THE ENERGY CONSUMPTION BEHAVIOR OF THE USER ⟋ 708

IDENTIFYING, USING A POLICY RULE CRAWLER, AN ENERGY CONSUMPTION REDUCTION INTEGRATION CORRESPONDING TO THE ONE OR MORE BEHAVIOR METRICS ⟋ 710

IDENTIFYING, USING A POLICY RULE CRAWLER, AN ENERGY CONSUMPTION REDUCTION INTEGRATION CORRESPONDING TO THE ONE OR MORE BEHAVIOR METRICS ⟋ 712

*FIG. 7*

SYSTEMS, METHODS, AND DEVICES FOR GREENHOUSE GAS MONITORING AND CONTROL

FIELD

Aspects of the present disclosure relate to systems and methods for monitoring and controlling greenhouse gas outputs (e.g., "carbon footprint") for a user and, more particularly, to a software-based greenhouse gas management platform.

BACKGROUND

Users generate vast quantities of personal data on a regular basis. For example, users consistently generate personal data through user interactions with various services provided by service providers, such as a mobile device provider or an electric vehicle provider. As technological capabilities increase, the personal data users generate reflects more and more facets of their daily lives. Although these behaviors also have a carbon footprint, users typically have little insight into, let alone how the data corresponds to their carbon footprint, let alone what personal data is being generated in the first place. Additionally, with the quantity of personal data being generated on a regular basis, it is impractical for the onus to be on users to manage and analyze their personal data to determine effective carbon footprint reduction strategies. Furthermore, service providers building green technology infrastructure and products often lack access to energy consumption data sources.

It is with these observations in mind, among others, that aspects of the present disclosure were conceived and developed.

SUMMARY

Implementations described and claimed herein address the foregoing by providing systems and methods for detecting and controlling a greenhouse gas output for a particular user. For instance, a method can identify, using a non-transitory storage media storing computer-readable instructions executable by one or more processor, one or more device identifiers corresponding to one or more devices associated with a user. The method can also store the one or more device identifiers in one or more databases; and/or receive, using the one or more processor accessing the one or more device identifiers, energy consumption-related data from the one or more devices resulting from an energy consumption behavior of the user. Furthermore, the method can determine, using the one or more processor and the energy consumption-related data, one or more behavior metrics indicative of the energy consumption behavior of the user. The method can also identify, using a policy rule crawler, an energy consumption reduction integration corresponding to the one or more behavior metrics. Moreover, by way of example, the method can integrate, using the one or more processor, the energy consumption reduction integration into a user profile associated with the user to facilitate a reduction of energy consumption for the user.

In another implementation, the method can comprise calculating, using the one or more processor and the energy consumption-related data, a plurality of score values from which a ranking value associated with the user, and corresponding to an aggregation of the energy consumption behavior, is determined. The plurality of score values can include at least one of a driving score value; an electric vehicle usage score value; and/or a battery degradation value. The method can also include determining that the ranking value is above or below a predetermined threshold value. Identifying the energy consumption reduction integration can be responsive to the ranking value being above or below the predetermined threshold value. Furthermore, the ranking value can relate to usage of an electric vehicle and the energy consumption reduction integration can be a credit. Integrating the energy consumption reduction integration into the user profile can include applying the credit to an account associated with the electric vehicle.

In another implementation, identifying the one or more device identifiers includes establishing a network connection between the one or more processor and an onboard computing device of an electric vehicle; and/or receiving an electric vehicle identifier from the onboard computing device. Additionally or alternatively, identifying the one or more device identifiers includes establishing a network connection between the one or more processor and a home appliance device; and/or receiving a home appliance identifier from the home appliance device. Furthermore, identifying the one or more device identifiers can include establishing a network connection between the one or more processor and a power system device; and/or receiving a power system device identifier from the power system device.

In another implementation, a computer-readable non-transitory memory device storing instructions that, when executed by a processor, performs various operations. The operations can include identifying one or more device identifiers corresponding to one or more devices associated with a user, at least one of the one or more device identifiers being an electric vehicle identifier. The operations can also include receiving energy consumption-related data from the one or more devices resulting from one or more energy consumption behaviors of the user, the one or more energy consumption behaviors including at least a driving behavior. Furthermore, the operations can include determining, based on the energy consumption-related data, one or more behavior metrics; identifying an energy consumption reduction integration corresponding to the one or more behavior metrics; and/or causing an indication of the energy consumption reduction integration to be presented at a user interface of a computing device associated with a user. Moreover, the operations can include receiving a user input at the user interface indicating an acceptance of the energy consumption reduction integration; and/or integrating, at least partly responsive to the user input, the energy consumption reduction integration into a user profile associated with the user to facilitate a reduction of energy consumption for the user.

In another implementation, determining the one or more behavior metrics includes calculating an amount of time of electric vehicle usage. The operations can also include calculating, based on the energy consumption-related data, a battery degradation rate for an electric vehicle, wherein the energy consumption reduction integration includes a battery replacement program. Additionally, the operations can include receiving a plurality of energy consumption-related data from a plurality of users; calculating a plurality of scores based on the plurality of energy consumption-related data; and/or causing a ranking, associated with the user and based on a comparison to the plurality of scores, to be presented at a mobile device of the user. Moreover, the operations can include receiving a plurality of energy consumption-related data from a plurality of users; determining a battery charging pattern based on the plurality of energy consumption-related data; and/or causing an indication of the battery charging pattern to be presented at a computing device associated with the user. The indication of the battery charging pattern can include an indication of an optimal charging time. Additionally or alternatively, the indication of the battery charging pattern can include an indication of an available battery charger.

In another implementation, a system of greenhouse gas detection and control, the system includes a device detection system, stored at a non-transitory storage media as computer-readable instructions executable by one or more processor, which identifies one or more device identifiers corresponding to one or more devices associated with a user. At least one of the one or more device identifiers can be an electric vehicle identifier. The system can also include a user behavior analyzer, stored at the non-transitory storage media as the computer-readable instructions executable by the one or more processor, which receives energy consumption-related data from the one or more devices resulting from energy consumption behavior of the user, and/or determines, based on the energy consumption-related data, one or more behavior metrics. Furthermore, the system can include a reduction integration generator, stored at the non-transitory storage media as the computer-readable instructions executable by the one or more processor. The reduction integration generator can identify an energy consumption reduction integration corresponding to the one or more behavior metrics; and/or cause an indication of the energy consumption reduction integration to be presented at a user interface of a computing device associated with a user. The reduction integration generator can also receive one or more user inputs at the user interface indicating an acceptance of the energy consumption reduction integration; and/or integrate, at least partly responsive to the one or more user inputs, the energy consumption reduction integration into a user profile associated with the user to facilitate a reduction of energy consumption for the user.

In another implementation, the user behavior analyzer includes a driving behavior assessment tool which calculates, based on the energy consumption-related data, an electric vehicle driving score; and/or a home energy consumption tool which calculates, based on the energy consumption-related data, a home device usage score, wherein the electric vehicle driving score or the home device usage score is used by the reduction integration generator to identify the energy consumption reduction integration. Furthermore, the reduction integration generator can include a policy rule crawler which accesses a plurality of databases of third-party entities to identify rebate or incentive programs related to energy consumption reduction. The energy consumption reduction integration can be based on the rebate or incentive programs. By way of example, the user behavior analyzer can receive at least a first portion of the energy consumption-related data as the one or more user inputs at the user interface, and a second portion of the energy consumption-related data directly from the one or more devices. Additionally, the system can further include a consumption verification tool which determines an accuracy of the first portion of the energy consumption-related data by comparing the first portion of the energy consumption-related data to the second portion of the energy consumption-related data. Moreover, the reduction integration generator can include a device control system which sends an instruction to the one or more devices to cause a device operational parameter modification for the one or more devices.

Other implementations are also described and recited herein. Further, while multiple implementations are disclosed, still other implementations of the presently disclosed technology will become apparent to those skilled in the art from the following detailed description, which shows and describes illustrative implementations of the presently disclosed technology. As will be realized, the presently disclosed technology is capable of modifications in various aspects, all without departing from the spirit and scope of the presently disclosed technology. Accordingly, the drawings and detailed description are to be regarded as illustrative in nature and not limiting.

BRIEF DESCRIPTION OF THE DRAWINGS

FIG. 7 illustrates an example method for monitoring and controlling a greenhouse gas output for a user, which can be performed by the example environment of FIG. 1.

DETAILED DESCRIPTION

Aspects of the presently disclosed technology generally relate to systems, methods, and devices for greenhouse gas detection, monitoring, control, and/or management. These systems, methods, and devices provide a platform for giving a user a greater understanding of their greenhouse gas output patterns (e.g., carbon footprint). Improvements in data collection efficiency, data analytics, and cross-device integration can provide actionable data at various levels of granularity for a multitude of use-case scenarios. Furthermore, the improved data collection techniques, and the corresponding access to better information, can result in device operational parameter changes and technology-driven user behavior changes, empowering users to reduce their greenhouse gas output (e.g., carbon footprint).

These systems, methods, and devices are rooted in the modern technological landscape of electric vehicle platforms and Internet-of-Things (IOT) platforms. As such, the technology disclosed herein can accelerate the large-scale transition to electric vehicles, renewable energy, and more sustainable industries by effectively converting consumption-related data into displayable, human-actionable information, device modification instructions, and other tangible outputs. Additional advantages of the disclosed technology will become apparent from the detailed description below.

Figure 1:
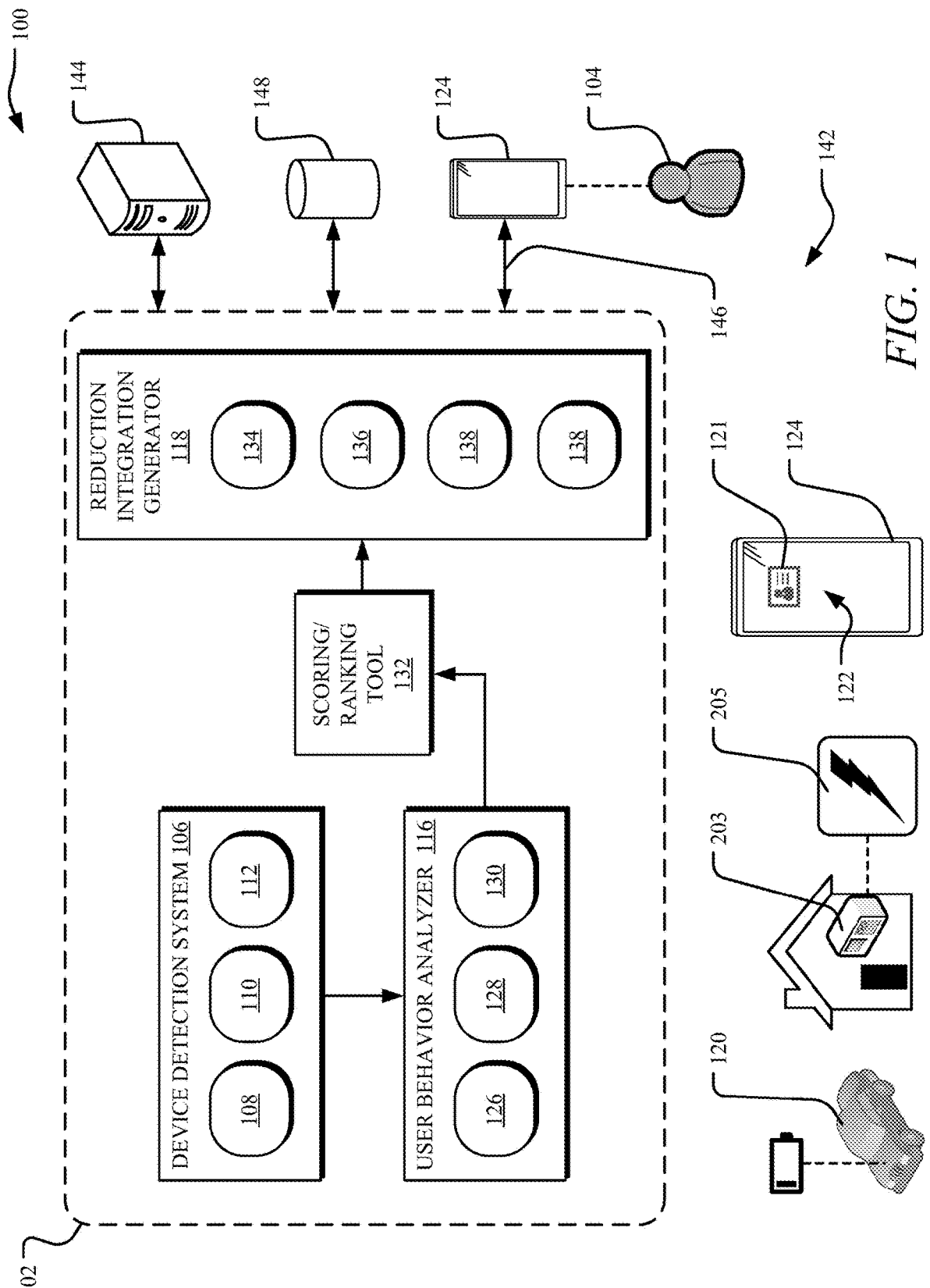
FIG. 1 illustrates an example system for monitoring and controlling a greenhouse gas output for a user.

To begin a detailed description of an example environment 100, reference is made to FIG. 1. In one implementation, the example environment 100 includes a greenhouse gas monitoring and control system 102 for detecting a greenhouse gas output pattern (e.g., "carbon footprint") for a user 104, and generating greenhouse gas reduction integrations for the user 104. The greenhouse gas monitoring and control system 102 can comprise various components for helping the user 104 track their greenhouse gas output pattern, providing the reduction integrations to reduce the greenhouse gas output of the user 104, and/or create behavioral incentives which further result in reducing their greenhouse gas output. For instance, the greenhouse gas monitoring and control system 102 can comprise a device detection system 106 which includes an electric vehicle detector 108, a home device detector 110, a personal device detector 112, and/or other device detectors 114. The greenhouse gas monitoring and control system 102 can also include a user behavior analyzer 116 for aggregating and analyzing device data to generate behavior outputs, such as behavior metric values 303, score values 304, and/or ranking values 305, corresponding to greenhouse gas-related behaviors. Furthermore, the greenhouse gas monitoring and control system 102 can comprise a reduction integration generator 118. As discussed in greater detail below, the reduction integration generator 118 can identify and/or generate systems or programs causing the user 104 to reduce their greenhouse gas output through behavioral modifications, device operation parameter modifications, credits (e.g., integrated tax rebates, incentive programs, and/or carbon offset programs) and the like. Each of these components of the greenhouse gas monitoring and control system 102 are discussed in greater detail below.

The device detection system 106 can receive and analyze data from various sources associated with the user 104 for determining the identities of that user's devices. For instance, the electric vehicle detector 108 of the device detection system 106 can receive identifying inputs indicating an electric vehicle 120 associated with the user 104. The identifying inputs can be provided manually by the user 104 into a front-end user interface 121 of an application 122 at a mobile device 124 of the user 104. Additionally or alternatively, identifying inputs can be received from a control system of the electric vehicle 120 via a wired connection (e.g., Universal Serial Bus (USB) connection) or a wireless connection (e.g., Wi-Fi, Bluetooth®, etc.) with the electric vehicle 120. The electric vehicle detector 108 can also receive the identifying inputs from a remote server providing software support for the electric vehicle 120, for instance, through a network connection (e.g., a cellular connection) with the mobile device 124.

Figure 2:
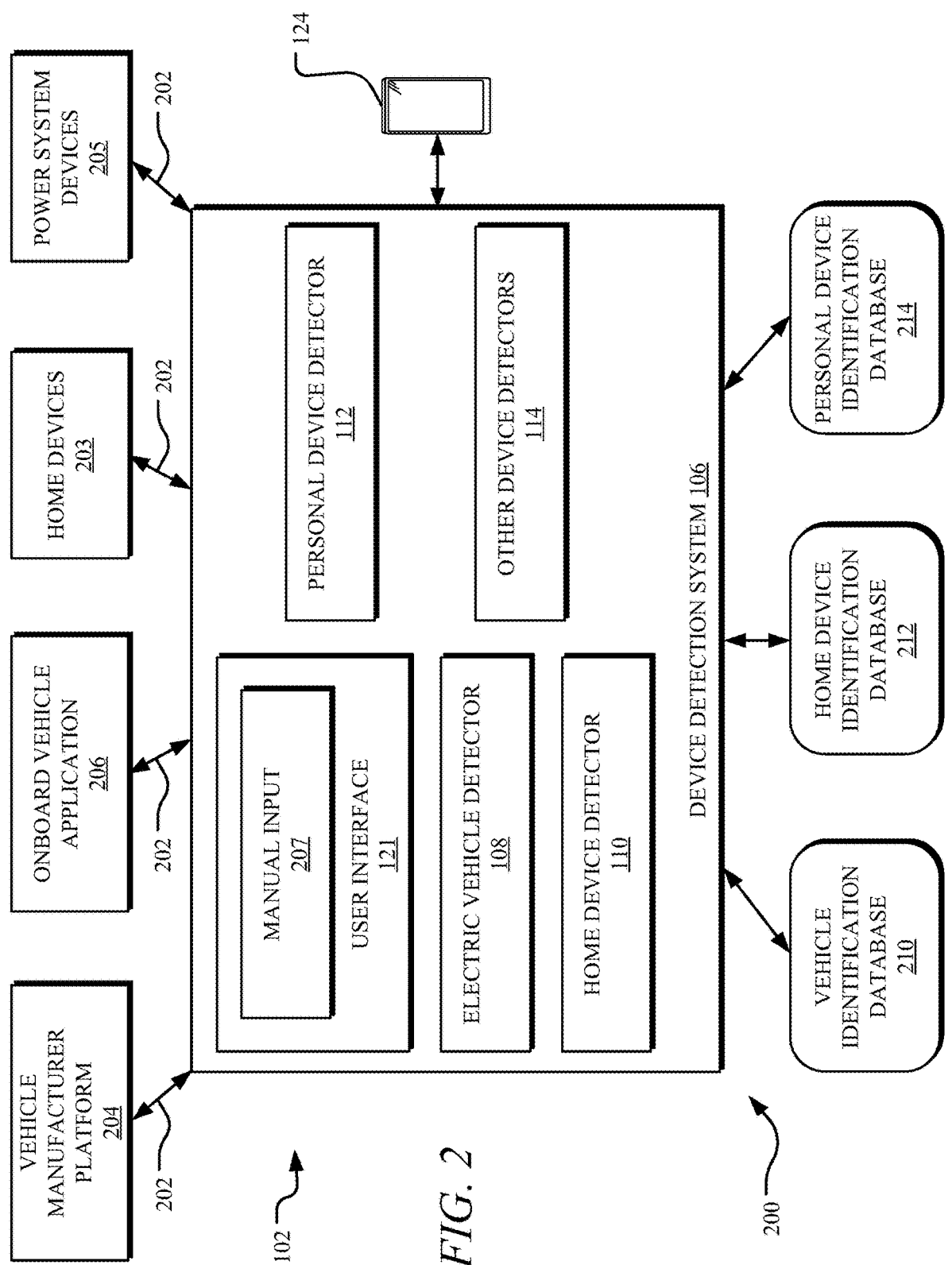
FIG. 2 is an example device detection system for monitoring and controlling a greenhouse gas output for the user, which can form at least a portion of the example system of FIG. 1.

The identifying data can be used to identify the electric vehicle 120 and/or establish an association between the electric vehicle 120 and the mobile device 124 associated with the user 104, a user profile associated with the user 104, and/or another vehicle associated with the user 104. FIG. 2 depicts additional details of techniques for collecting and analyzing the identifying data (e.g., at the home device detector 110, the personal device detector 112, and/or other device detectors 114).

Once the data-generating devices are identified, the user behavior analyzer 116 can receive, aggregate, and/or analyze user data (e.g., energy consumption-related data) from these devices to determine behavior metrics 303 indicative of greenhouse gas generation. For instance, the user behavior analyzer 116 can use a driving behavior assessment tool 126 to capture and analyze data relevant to driving behavior to determine driving patterns and driving events. A home energy consumption tool 128 can capture and analyze data relevant to home power usage, such as appliance data, solar power system data, battery storage data, and so forth. A personal energy consumption assessment tool 130 can capture and analyze other behavior data from the mobile device 124, or other sources of user interaction, to determine other user behaviors which can impact a greenhouse gas output beyond the vehicle and home. Moreover, the energy consumption-related data can be data associated with a user (e.g., a user profile), such as an indication that the user is associated with a reduced-emissions device, such as an electric vehicle (e.g., owns, rents, and/or uses). Accordingly, determining a behavior metric indicative of an energy consumption behavior based on the energy consumption-related data can include determining an ownership, usage, and/or association with an electric vehicle.

Furthermore, the user behavior analyzer 116 can include a scoring and/or ranking tool 132 to convert the behavior metrics 303 into greenhouse gas usage performance values. For instance, various sub-behaviors determined by the driving behavior assessment tool 126 can be converted into driving values or scores, such as a braking score, an acceleration score, a route choice score, etc. The scores generated by the ranking tool 132 can be scaled scores compared to historical data. The subcomponents of the user behavior analyzer 116 are discussed in greater detail below regarding FIG. 3.

The reduction integration generator 118 can include subcomponents for matching the user 104 with systems or programs which cause the user 104 to reduce their greenhouse gas output and/or receive incentives corresponding to their greenhouse gas-related behavior. The reduction integration generator 118 can include a behavior recommendation engine 134, a policy rule crawler 136, a device control system 138, and/or a greenhouse gas usage report generator 140. The subcomponents of the reduction integration generator 118 are discussed in greater detail below regarding FIG. 4.

In some instances, the greenhouse gas monitoring and control system 102 operates in a network environment 142 as various software modules operating on different devices throughout the network environment 142. The network environment 142 can include multiple computer systems such as the mobile device 124, the electric vehicle 120 (e.g., an onboard computing device integrated into the electric vehicle 120), and one or more servers 144. The computer systems can use one or more network connection(s) 146 to communicate with each other and/or database(s) 148 storing the data disclosed herein. The network environment 142 and it's various computing devices used to implement the greenhouse gas monitoring and control system 102 are discussed below regarding FIGS. 5 and 6.

Turning to FIG. 2, an example environment 200 includes the greenhouse gas monitoring and control system 102 using the device detection system 106 to identify the various devices from which greenhouse gas-related data can be collected.

In some instances, the device detection system 106 can communicate with or form a part of different software platforms to receive device data 202 used to identify the various user devices. For instance, a vehicle manufacturer platform 204, an onboard vehicle application 206 of the electric vehicle 120, or the mobile device 124 can provide device data 202 to the electric vehicle detector 108 via their respective Application Programming Interfaces (API) s. The vehicle manufacturer platform 204 or the onboard vehicle application 206 can send one or more messages including at least one of a Vehicle Identification Number (VIN), a manufacturer name, a model name, a model version, a model year, a vehicle specification (e.g., number of cylinders, a fuel type, and so forth), combinations thereof, and so forth. The device data 202 can also include an EV category for the vehicle (e.g., EV, fully electric, plug-in hybrid, internal combustion engine, etc.). This device data 202 can be received at the mobile device 124 running the application 122 of the greenhouse gas monitoring and control system 102, and/or at a remote server 144 of the greenhouse gas monitoring and control system 102. Then the vehicle identification data can be stored in a vehicle identification database 210 associated with the user 104. The device data 202 can be stored in the database(s) 148 associated with a user profile of the user 104 and/or other user data, such as a unique user ID number, another user ID number associated with the user 104, another vehicle identifier associated with the user 104, and so forth. In some instances, the greenhouse gas monitoring and control system 102 can determine additional vehicle specification data based on the received device data 202.

The greenhouse gas monitoring and control system 102 can access one or more databases 148 storing archived vehicle specifications from which this additional details can be determined. For example, the greenhouse gas monitoring and control system 102 can determine a number and/or type of sensors of the electric vehicle 120 based on a VIN and/or model type. Additionally or alternatively, the greenhouse gas monitoring and control system 102 can determine a battery type specific to the electric vehicle 120 and/or the type of sensors. The various data structures discussed herein for receiving, analyzing, determining, and storing the device data 202 can improve data processing and storage efficiencies of the network environment 142, and the computing devices 600, by reducing data storage redundancies and algorithm steps of the greenhouse gas monitoring and control system 102.

Moreover, the device detection system 106 can receive the device data 202 using the home device detector 110 to identify electrical devices associated with a home of the user 104 (e.g., home devices 203). This home device data can be received via voltage signals sent through the underlying power system of the home (e.g., the 120 AV power lines), and/or various local area networks (LAN) s of the home, such as a Wi-Fi network or an ethernet network. The home device data can include one or more device identifiers associated with home appliance(s) such as a dishwasher identifier, a washing machine identifier, a clothes dryer identifier, a hair dryer identifier, a heater identifier, an air conditioner identifier, an HVAC system identifier, a microwave identifier, a vacuum cleaner identifier, a computer identifier, a server identifier, and so forth. These home device identifiers can be stored in the one or more databases 148, such as a home device identification database 212 with an association to the user 104.

Additionally, the home device identifiers can include identifiers for power generation system(s) of the home. For example, the device detection system 106 can receive an identifier from one or more power system device(s) 205, such as a solar power system, a wind power system, a hydropower system, a geothermal power system, a battery system, and so forth. In other words, the device detection system 106 can receive an identifier corresponding to a particular battery manufacturer and/or model used by the home power system, an identifier corresponding to a particular solar panel manufacturer and/or model, a wind turbine manufacturer and/or model, a power generator manufacturer and/or model, and so forth. The device detection system 106 can store these power system component identifiers in the one or more database(s) 148. In some instances, the database(s) 148 can also store archived device system data including the various device identifiers, which can be used as a reference for comparing and correlating the received data with the particular device identification details. Moreover, the device data 202 identifying devices associated with the user 104 can be provided as a manual input 207 at the front-end user interface 121 (e.g., by interacting with one or more prompts presented at the mobile device 124).

In some examples, the greenhouse gas monitoring and control system 102 can receive power consumption data from the home devices 203, or power generation data from the power system devices 205 and can determine the home device identifier(s) based on an analysis of this data. The device detection system 106 can compare the power consumption data or the power generation data to stored power consumption profiles and, based on a statistical analysis, can determine a likelihood that the power consumption data or the power generation data correlates to a particular device (e.g., a vehicle, an appliance, a power system device 205, etc.). If the device detection system 106 can determine that the likelihood is greater than a predetermined threshold value, the device detection system 106 can establish the identity of that device and store this association in the database(s) 148.

Furthermore, the device detection system 106 can include the personal device detector 112 and/or various other device detectors 114 for capturing additional user data. The personal device detector 112 can communicate with the mobile device 124 to identify the mobile device 124, such as a mobile device name, a model number, and/or a manufacturer. In some instances, the personal device detector 112 identifies multiple devices associated with user, such as the mobile device 124, a smart watch, a personal fitness device, a personal health device (e.g., a pacemaker), a tablet computer, a wearable device, and the like. Furthermore, the device detection system 106 can identify various software components of the device(s), such as an operating system, an operating system version, and/or one or more. By way of example, the device detection system 106 can determine particular types of applications operating on the mobile device 124, such as a power management application, an internet-of-things (IoT) controller application, a smart appliance application, a security camera application, and so forth. These personal device and/or application identifiers can be stored in the one or more databases 148, such as a personal device identification database 214 and can be associated with the user 104.

In some examples, the device data 202 includes identifying inputs received as part of a setup procedure with the electric vehicle 120. Upon initially operating the electric vehicle 120, prompts can be generated at the front-end user interface 121 to request the inputs identifying the electric vehicle 120. Moreover, one or more APIs of the vehicle software can send the identifying inputs to the greenhouse gas monitoring and control system 102 as a back-end operation of the setup procedure. The identifying inputs can also be sent and received by the greenhouse gas monitoring and control system 102 as part of a startup procedure whenever the electric vehicle 120 turns on and/or detects the mobile device 124 is within a predetermined proximity of the electric vehicle 120. This device data 202 identifying the electric vehicle 120 can be sent to the greenhouse gas monitoring and control system 102 responsive to an API call from the greenhouse gas monitoring and control system 102 requesting such information. Additionally or alternately, the identifying inputs can be sent to the greenhouse gas monitoring and control system 102 periodically according to a recurring schedule (e.g., hourly, daily, weekly, monthly, etc.). Once the devices and/or applications are identified, communication links can be established with the identified devices and/or applications to receive usage data, as discussed in greater detail below.

Figure 3:
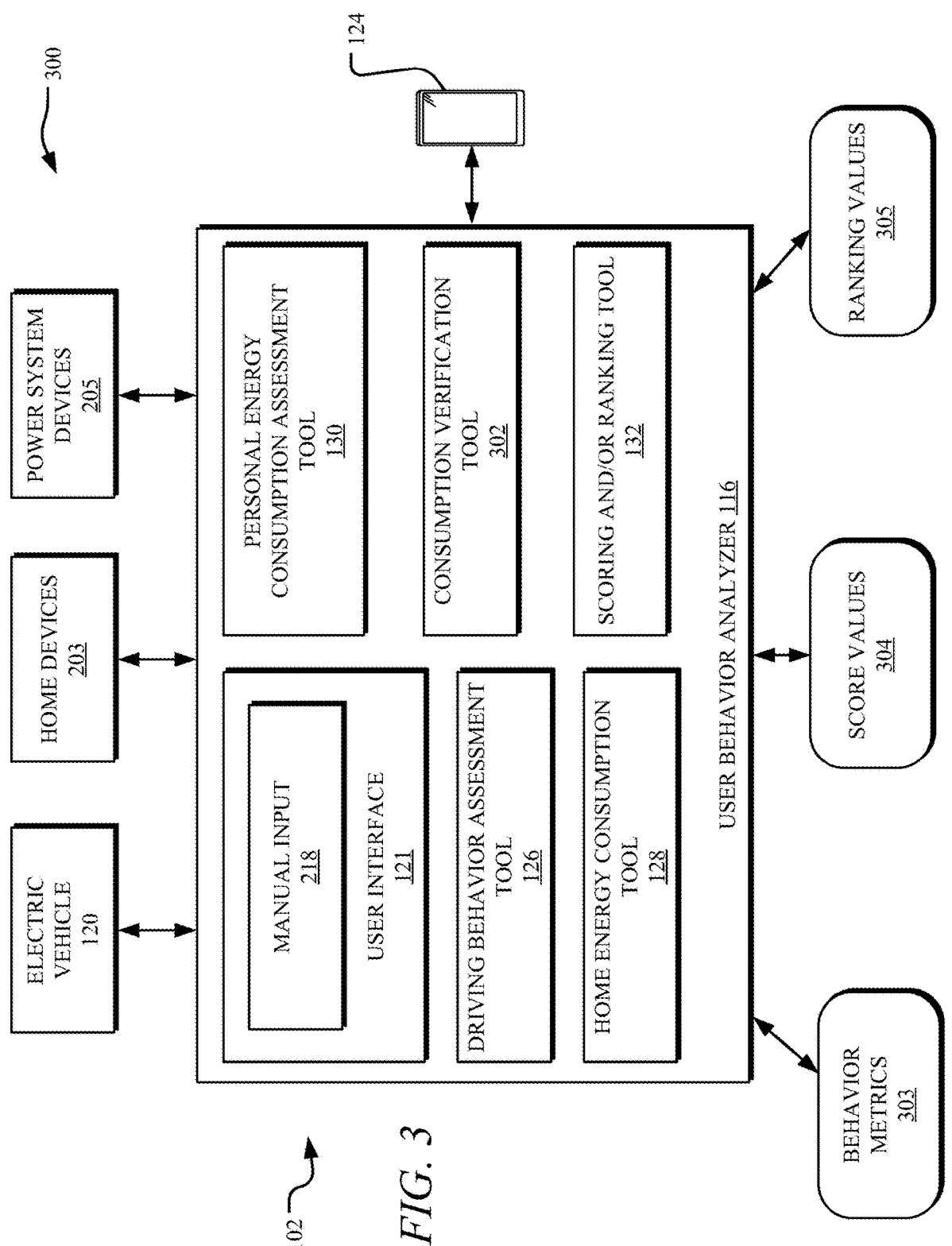
FIG. 3 illustrates an example user behavior analyzer for monitoring and controlling a greenhouse gas output for the user, which can form at least a portion of the example system of FIG. 1.

Referring to FIG. 3, an example environment 300 shows the greenhouse gas monitoring and control system 102 including the user behavior analyzer 116, which can collect the device data 202 and generate behavior scores 304 and rankings 305 associated with the user 104 based on the energy consumption-related data.

In some examples, the user behavior analyzer 116 can receive, aggregate, and/or analyze the device data 202 to generate behavior metrics 303 associated with the user 104. The behavior metrics 303 can be indicative of greenhouse gas generation activity and/or can correlate to energy consumption patterns. For instance, the user behavior analyzer 116 can use the driving behavior assessment tool 126 to capture and analyze data from the electric vehicle 120, such as from a telematics device of the electric vehicle 120, an on-board diagnostics (OBD) device of the electric vehicle 120, sensors of the electric vehicle 120 (e.g., motion sensors, LIDAR sensor, cameras, etc.) and/or the onboard vehicle application 206. The user behavior analyzer 116 can determine that the data is relevant to driving behavior and/or can use the data to determine driving patterns and driving events.

For instance, based on the received data, the driving behavior assessment tool 126 can determine an amount of EV usage in seconds, minutes, and/or hours, an average amount of EV usage per day, a time of day of EV usage, an amount of non-electric vehicle usage, an average amount of non-electric vehicle usage, a time of day of non-electric vehicle usage, a mileage, a ratio of EV usage to non-electric vehicle usage, and/or usage of a towing service. A home or garage location, route pattern, and/or destination location can also be provided to the driving behavior assessment tool 126. In some instances, data indicating a number of vehicles used by the user 104 and/or that the user 104 is retiring or selling an internal combustion engine vehicle can also be collected. The driving behavior assessment tool 126 can further determine the software settings and/or usage of the driving modes of the electric vehicle 120. These can include a low energy mode, an off-road mode, a rock-climbing mode, a 2-wheel drive mode, a 4-wheel drive mode, or combinations thereof. The software settings can relate to battery power consumption and/or motor settings. Additionally, geographic information can also be received and analyzed by the driving behavior assessment tool 126, such as a type of road (e.g., highway, arterial, residential, paved, gravel, double track, etc.), a grade of a route, and/or weather conditions during travel. For instance, the user behavior analyzer 116 can determine that colder weather impacts a battery degradation rate. As discussed in greater detail below, this EV-related data, and the other consumption-related data discussed herein, can be provided to the scoring and/or ranking tool 132 for generating scores 304 and/or rankings 305 associated with the user 104.

The home energy consumption tool 128 can capture and analyze data relevant to home power usage, such as appliance data, solar power system data, battery storage data, and so forth. For instance, the home energy consumption tool 128 can receive a voltage signal from a power line of the home and can analyze the voltage signal to identify usage events and/or patterns corresponding to particular home devices 203. Moreover, the home energy consumption tool 128 can establish network connection(s) (e.g., Wi-Fi or Bluetooth®) with the home device(s) 203 to receive energy consumption data directly from the home device(s) 203. Additionally or alternatively, to receive the home device power consumption data, the home energy consumption tool 128 can communicate with various applications on the mobile device 124, such as an appliance-specific application, an appliance manufacturer application, and/or a power management application.

In some instances, power consumption data received by the home energy consumption tool 128 can indicate operations of power system subcomponents. For example, the greenhouse gas monitoring and control system 102 can determine how much charging has occurred at a vehicle charging station and/or charging patterns at the charger (e.g., frequency, time of day, etc.). Furthermore, the home energy consumption tool 128 can determine whether the user 104 is drawing power from a battery system, from the grid, or combinations thereof. Data indicating whether the user 104 draws power at peak times or at off-peak times can also be collected. Furthermore, the home energy consumption tool 128 can determine whether the power system has a net positive power generations over a particular period of time, whether the power system provide energy back to the grid, and/or an amount of energy the power system provides back to the grid.

A personal energy consumption assessment tool 130 can capture and analyze other behavior data from the mobile device 124, or other sources of user interaction, to determine other user behaviors which can impact their greenhouse gas output beyond the vehicle and home. For example, the personal energy consumption assessment tool 130 can determine an amount of time walking or riding a bicycle (e.g., via a communication with a fitness application), an amount of public transportation usage (e.g., via a communication with a travel application), an amount of airline travel (e.g., via a communication with an airline application), an amount of patronage at a type of store (e.g., a solar power supply store), an amount of participation in a greenhouse gas reduction event (e.g., a tree planting event), and so forth. This personal energy consumption data can be provided to the scoring and/or ranking tool 132, and can influence the behavior metrics 303, scores 304, and rankings 305 that tool generates.

Additionally, the user 104 can submit energy consumption-related data to the user behavior analyzer 116 by providing manual input 207 to the front-end user interface 121 (e.g., an input indicating ownership, usage, or other association with an electric vehicle). The user behavior analyzer 116 can include a consumption verification tool 302 to perform verification operations for the manually submitted consumption data. These verification operations can include accessing the consumption data collected by the driving behavior assessment tool 126, the home energy consumption tool 128, and/or the personal energy consumption assessment tool 130. Then the consumption verification tool 302 can cross-reference this consumption data with that provided by the user 104 (e.g., perform a comparison). Additionally or alternatively, the consumption verification tool 302 can build a verification model based on historical usage data of the user 104 and/or a plurality of other users. The verification model can include predicted values based on calculated averages for particular consumption values over particular periods of time. Verification data used by the verification model to perform the verification operations can include a home square footage, a solar panel array square footage, a number of wall power outlets, EV charging patterns, a number of EVs, a charging profile, a seasonality profile, and/or a building type (e.g., residential, industrial, or commercial). In some instances, the consumption verification tool 302 can be used to detect a fraudulently submitted consumption report, such as a user overstating usage of their electric vehicle 120 or renewable power systems (e.g., solar systems, charging systems, battery systems, and the like).

Furthermore, the user behavior analyzer 116 can include a scoring and/or ranking tool 132 to convert the behavior metrics 303 into greenhouse gas usage performance values. For instance, various sub behaviors determined by the driving behavior assessment tool 126 can be converted into driving values or scores, such as a braking score, an acceleration score, a route choice score, etc. The scores generated by the ranking tool 132 can be scaled based on a comparison to historical data.

In some scenarios, the scoring and/or ranking tool 132 can include one or more machine learning models which can be trained with historical data and/or can be used to determine statistically relevant patterns from the behavioral metrics. The scoring and/or ranking tool 132 can include various sub-models which can be aggregated to calculate one or more score values 304 associated with the sub-models. For instance, the scoring and/or ranking tool 132 can create a charging model to collect and aggregate the charging-related data into an EV charging score. The scoring and/or ranking tool 132 can create a vehicle model, which aggregates the vehicle-related data into one or more vehicle score(s). The vehicle score(s) can represent various dimensions of the electric vehicle 120 and/or the driving behavior, such as an indication of a driving style (e.g., passive or aggressive), acceleration profiles, braking profiles, turning profiles, and/or usage times for different driving modes. The vehicle model can receive multiple scores of multiple users which can, in turn, be used to rank different electric vehicles 120 based on their carbon footprint, charging profiles, usage amounts, battery degradation rate, etc. In some instances, the vehicle model can also be used to generate a battery score, which can indicate a battery degradation rate and/or whether the battery degradation rate is higher than an average value. The scoring and/or ranking tool 132 can also use the vehicle model to determine electric vehicle types which have their tires replaced more frequently.

From the score values 304 generated by the scoring and/or ranking tool 132, one or more rankings 305 can be derived. For instance, the scoring and/or ranking tool 132 can aggregate and/or weigh the various behavior metrics 303 and score values 304 associated with the user 104. The scores 304 can be compared to one or more predetermined threshold values (e.g., stored in the database(s) 148) to determine the rankings 305. Additionally or alternatively, the behavior metrics 303 and score values 304 associated with the user 104 can be compared to average behavior metrics 303 and/or average score values 304 determined from historical data and/or a machine-learning training data set. From these comparisons, a ranking value 305 for the user 104 can be calculated and outputted.

Figure 4:
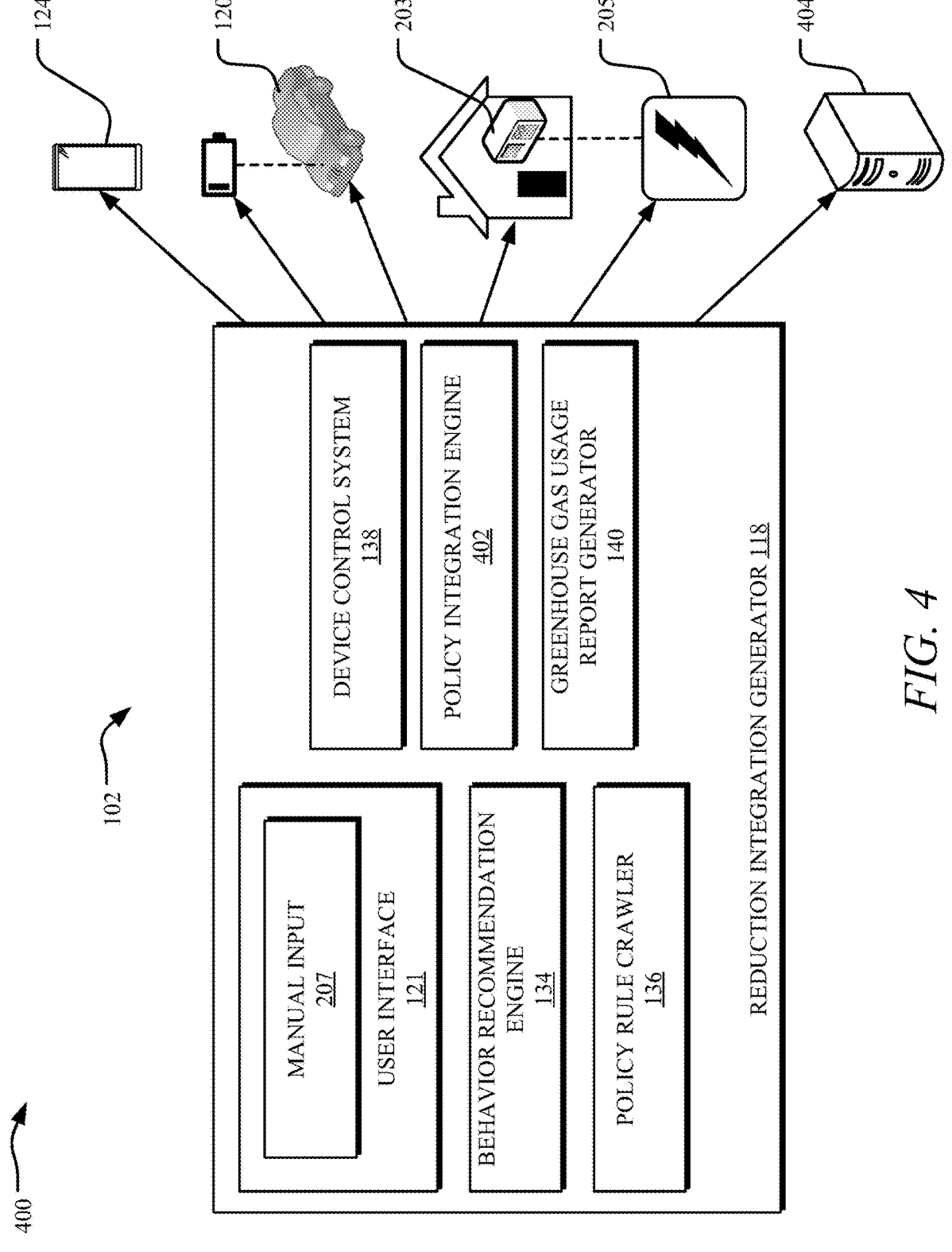
FIG. 4 an example reduction integration generator for monitoring and controlling a greenhouse gas output for the user, which can form at least a portion of the example system of FIG. 1.

Referring to FIG. 4, an example environment 400 shows the greenhouse gas monitoring and control system 102 including the reduction integration generator 118 which can identify and/or generate systems or programs causing the user 104 to reduce their greenhouse gas output.

In some examples, the outputs generated by the reduction integration generator 118 can be integrated into a greenhouse gas profile of the user 104. This can include behavioral modifications of the user 104, modifications to operational parameters of devices associated with the user 104, or integrating an incentive program, carbon offset program, credit (e.g., tax rebate), and so forth to an account or profile of the user 104. Moreover, as discussed in greater detail below, the reduction integration generator 118 can cross-implement these different features, for instance, by integrating an incentive program output into a behavior modification recommendation or a device operational parameter modification.

For instance, the behavior recommendation engine 134 can generate one or more behavior recommendations for the user 104 to be presented at the mobile device 124. The behavior recommendation engine 134 can determine that a behavior metric value 303, score value 304, or ranking value 305 is above or below a predetermined value. Based on this determination, the behavior recommendation engine 134 can determine a particular behavior that is likely to increase or decrease the behavior metric 303, score value 304, or ranking value 305 bringing it closer the predetermined value. The behavior recommendation engine 134 can then convert this determination into a textual description in a human-readable language and can cause the textual description of the recommendation to be presented at the mobile device 124 (e.g., as a visual indicator at the front-end user interface 121 and/or as an audio output).

For example, the behavior recommendation engine 134 can generate a recommendation to increase usage of the electric vehicle 120. Additionally or alternatively, the behavior recommendation engine 134 can provide a recommendation to modify a driving behavior (e.g., to change a braking or acceleration pattern, change a route, etc.). Moreover, the behavior recommendation can include an indication that a battery should be extracted and/or replaced. The behavior recommendation can also include an indication of an optimal battery charging time and/or optimal energy usage time (e.g., off-peak hours). These behavior recommendations can be cross correlated to an identified incentive program, such that the behavior recommendation can include a textual indication that adopting the behavioral modification may result in qualification for the incentive program. Furthermore, in some scenarios, the behavior recommendation engine 134 can consider the manual input 207 provided by the user 104, which can indicate a preference or interest of the user 104. The manual input 207 can be used to weigh the different types of recommendations as being more likely or less likely to be followed.

In some scenarios, the policy rule crawler 136 can access and/or crawl various databases to determine one or more credit(s). The credit(s) can be gas-related and/or can include one or more tax credit programs, incentive programs, regulatory changes, discounts, product offerings and so forth. For instance, the reduction integration generator 118 can review one or more state government databases indicating one or more tax credit options. Upon identifying a credit (e.g., a tax credit option), a policy integration engine 402 of the reduction integration generator 118 can determine whether the user 104 has a behavior metric value 303, score 304, or ranking 305 corresponding to the credit. If the system determines that the user 104 has the behavior metric value 303, score value 304, or ranking value 305 corresponding to the credit, the system can apply the credit directly to one or more accounts associated with the user 104 (e.g., a user profile of the user 104). For instance, the credit can be applied to an insurance premium of the user 104, a roadside assistance purchase of the user 104, a low-carbon home device purchase of the user 104 (e.g., an EV charger, a solar panel, a battery system, etc.), or another electric vehicle-related product or service. In one example, the greenhouse gas monitoring and control system 102 can determine whether the user 104 qualifies for a credit (e.g., a rebate) based on an EV purchase and/or an amount of EV usage. The reduction integration generator 118 can determine that an amount of EV usage is above a threshold and thus the user 104 qualifies, or that the user 104 is not using the electric vehicle 120 and, accordingly, does not qualify. Moreover, the reduction integration generator 118 can generate a scaled credit for the user that scales with the various behavioral metrics discussed above (e.g., an amount of driving the EV, an amount of time in automated driving mode, etc.) Any of the behavioral metrics 303, scores 304, or rankings 305 discussed herein may be the basis on which the reduction integration generator 118 applies a particular credit, policy rule, rebate, discount, or incentive to a user 104. In some examples, a credit can be a battery extraction or replacement credit that is generated and applied based on a battery degradation rate score outputted by the scoring and/or ranking tool 132.

Additionally or alternatively, the reduction integration generator 118 can generate one or more external greenhouse gas reduction integrations, which are integrated into a system external to the user 104, such as a database or server of a third-party entity 404. For instance, the reduction integration generator 118 can generate and implement a donation or a scaled donation to a non-profit organization based on the outputs of the user behavior analyzer 116. The non-profit organization can be determined based on the manual input 207 provided to the front-end user interface 121, for instance, at a prompt presented at a display of the mobile device 124. Moreover, the reduction integration generator 118 can generate one or more carbon credits based on the outputs of the user behavior analyzer 116. The carbon credit(s) may be associated with an account of the user 104 and/or can be put onto a carbon credit exchange for purchase by others. In some scenarios, a carbon credit exchange can include an underlying decentralized ledger (e.g., a blockchain) for ensuring security and accuracy of the exchange. In one example, the policy rule crawler 136 can identify a credit from a utility company database corresponding to a solar installation. The credit can be applied to a user account based on an output from the home device detector 110 and/or the home energy consumption tool 128.

Furthermore, the reduction integration generator 118 can include the device control system 138 to modify operational parameters of the home device(s) 203. For instance, using the API call protocols to communicate with the home device(s) 203, the device control system 138 can change an operational setting that results in an energy reduction for that device. This can include adjusting a time of operation for the device to an off-peak hour, lowering a temperature threshold value (e.g., for HVAC system, heaters, washing machines, etc.), adjusting a driving mode of the electric vehicle 120, or providing other software updates, which may improve efficiency of the home device 203.

In some examples, the policy integration engine 402 can integrate a policy rule detected by the policy rule crawler 136 into another system of the user 104 based on the behavior scores/rankings generated by the user behavior analyzer 116. For instance, the policy integration engine 402 can generate a cost reduction, which is incorporated into an insurance policy associated with user 104, based on outputs of the driving behavior assessment tool 126.

In some examples, the greenhouse gas monitoring and control system 102 includes the greenhouse gas usage report generator 140 for aggregating and outputting information generated by the various components of the greenhouse gas monitoring and control system 102. The reports created by the greenhouse gas usage report generator 140 can be presented as user-facing information presented at a display of the mobile device 124. In some examples, the report output can include an indication of the rankings 305 and scores 304 generated for the user 104 and/or the reduction integrations generated by the reduction integration generator 118 (e.g., an amount of tax credit earned). The report output presented at the mobile device 124 can also include one or more indications of the consumption data (e.g., aggregated energy usage) and/or indications of the driving behaviors. Furthermore, the report output can include a result of aggregating and analyzing the data of the user 104 relative to other historical data of a plurality of other users. For instance, the report output can indicate how the behavior metrics 303 of the user 104 compares to other users, such as other users in a same or different area as the user 104, other users of a same or different age range as the user 104, other users having a same or different electric vehicle 120 as the user 104, or combinations thereof. By way of example, the report can indicate an optimal charging time and/or an availability time for one or more chargers. The greenhouse gas usage report generator 140 can form a part of or communicate with the behavior recommendation engine 134 to generate outputs with behavioral suggestions, as discussed above.

Additionally or alternatively, the greenhouse gas usage report generator 140 can generate a report output which is sent to and/or presented at a device of the greenhouse gas monitoring and control system 102, or other third-part entities. For instance, the greenhouse gas usage report generator 140 can aggregate multiple behavior metrics 303, scores 304, and rankings 305 of a plurality of users, and can send this data to a vehicle manufacturer server, a governmental entity server, or the like. The data can have value for such entities by providing highly accurate and granular information about actual EV usage and/or reduced carbon footprint initiative implementation rates, and can result in infrastructure construction or product development implementations. For instance, the report output can indicate which EVs have the highest level of usage and/or battery degradation. The report output can also indicate optimal battery charger locations based on analyzing the aggregated data. Numerous other valuable insights to electric vehicle usage and power consumption patterns can be generated and outputted using the technology disclosed herein.

Figure 5:
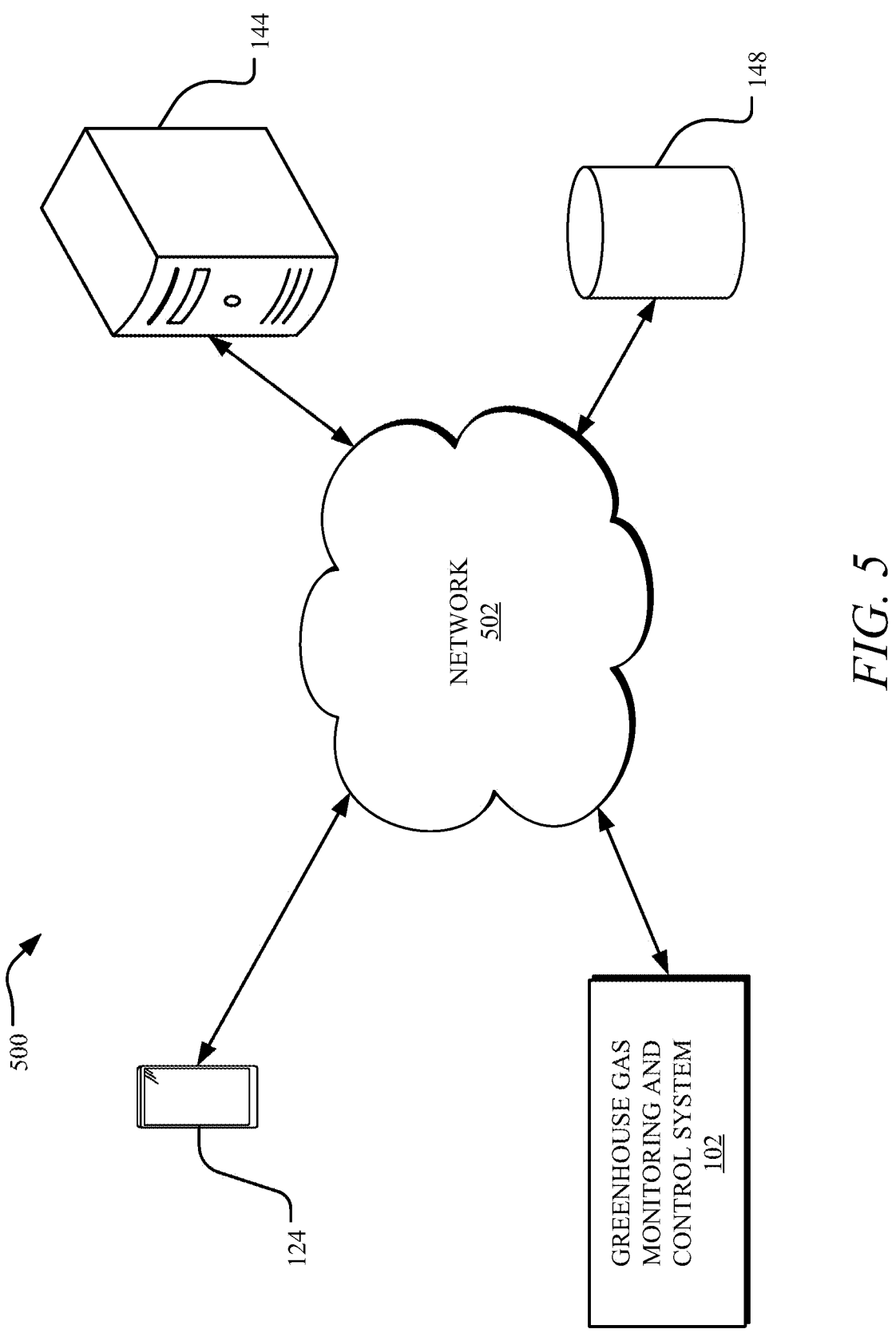
FIG. 5 illustrates an example network environment for monitoring and controlling a greenhouse gas output for the user, which can implement the example system of FIG. 1.

Turning to FIG. 5, an example network environment 500 of a power consumption ecosystem for implementing the greenhouse gas monitoring and control system 102 is illustrated. As depicted in FIG. 5, a network 502 is used by one or more computing or data storage devices for implementing the greenhouse gas monitoring and control system 102. The greenhouse gas monitoring and control system 102 may generate one or more user interfaces (e.g., the front-end user interface 121) for interaction with various aspects of the greenhouse gas monitoring and control system 102 by one or more computing devices 600 (e.g., the computing system 600 depicted in FIG. 6).

In one implementation, the computing devices 600, one or more databases 148, and/or other network components or computing devices described herein are communicatively connected to the network 502. Examples of the computing devices 600 include a terminal, personal computer, a smartphone, a tablet, a mobile computer, a workstation, and/or the like. The computing devices 600 may include the mobile device 124 and include or otherwise be associated with a provider system. For example, the computing devices 600 may include one or more provider servers executing service-based applications associated with service providers of the greenhouse gas monitoring and control system 102. The databases 148 may include the vehicle identification database 210, the home device identification database 212, the personal device identification database 214, and/or other databases and data structures.

As shown in FIG. 5, a server 144 can host the network environment 500. In one implementation, the server 144 also hosts a website or an application that users may visit to access the greenhouse gas monitoring and control system 102, the behavior metrics 303, scores 304, rankings 305, or other outputs discussed herein. The server 144 may be one single server, a plurality of servers with each such server being a physical server or a virtual machine, or a collection of both physical servers and virtual machines. In another implementation, a cloud hosts one or more components of the greenhouse gas monitoring and control system 102. The greenhouse gas monitoring and control system 102, the computing devices 600, the server 144, and other resources connected to the network 502 may access one or more additional servers for access to one or more websites, applications, web services interfaces, and/or the like.

Figure 6:
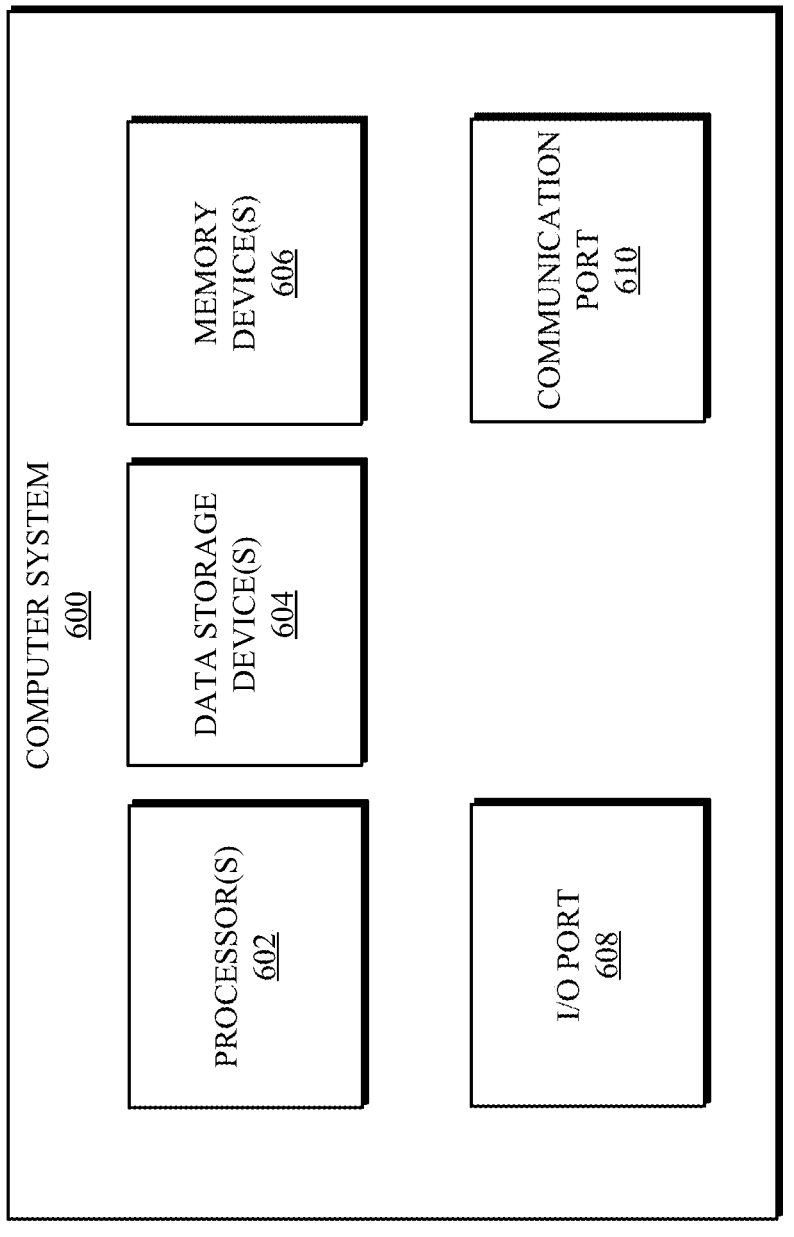
FIG. 6 illustrates an example computing system for monitoring and controlling a greenhouse gas output for the user, which can implement the example system of FIG. 1.

Referring to FIG. 6, a detailed description of an example computing system 600 having one or more computing units to implement various systems and methods discussed herein is provided. The computing system 600 may be applicable to the mobile device 124, the electric vehicle 120, the server(s) 144, the telematics device of the electric vehicle 120, the onboard vehicle computing device, the home device(s) 203, the personal device(s), and other computing or network devices. It will be appreciated that specific implementations of these devices may be of differing possible specific computing architectures not all of which are specifically discussed herein but will be understood by those of ordinary skill in the art.

The computer system 600 may be a computing system capable of executing a computer program product to execute a computer process. Data and program files of the greenhouse gas monitoring and control system 102 may be input to the computer system 600, which reads the files and executes the programs therein. Some of the elements of the computer system 600 are shown in FIG. 6, including one or more hardware processors 602, one or more data storage devices 604, one or more memory devices 606, and/or one or more ports 608-610. Additionally, other elements that will be recognized by those skilled in the art may be included in the computing system 600. Various elements of the computer system 600 may communicate with one another by way of one or more communication buses, point-to-point communication paths, or other communication means.

The processor 602 may include, for example, a central processing unit (CPU), a microprocessor, a microcontroller, a digital signal processor (DSP), a graphics processing unit (GPU), and/or one or more internal levels of cache. There may be one or more processors 602, such that the processor 602 comprises a single central-processing unit, or a plurality of processing units capable of executing instructions and performing operations in parallel with each other, commonly referred to as a parallel processing environment.

The computer system 600 may be a conventional computer, a distributed computer, or any other type of computer, such as one or more external computers made available via a cloud computing architecture. The presently described technology is optionally implemented in software stored on the data storage device(s) 604, stored on the memory device(s) 606, and/or communicated via one or more of the ports 608-610, thereby transforming the computer system 600 in FIG. 6 to a special purpose machine for implementing the operations described herein, and providing many practical applications for the technology. Examples of the computer system 600 include personal computers, terminals, workstations, mobile phones, tablets, laptops, personal computers, wearable devices, multimedia consoles, gaming consoles, set top boxes, and the like.

The one or more data storage devices 604 may include any non-volatile data storage device capable of storing data generated or employed within the computing system 600, such as computer-executable instructions for performing a computer process, which may include instructions of both application programs and an operating system (OS) that manages the various components of the computing system 600. The data storage devices 604 may include, without limitation, magnetic disk drives, optical disk drives, solid state drives (SSDs), flash drives, and the like. The data storage devices 604 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 606 may include volatile memory (e.g., dynamic random-access memory (DRAM), static random-access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 604 and/or the memory devices 606, which may be referred to as machine-readable media or computer-readable media. It will be appreciated that machine-readable media may include any tangible non-transitory medium that is capable of storing or encoding instructions (e.g., computer-readable instructions) to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 600 includes one or more ports, such as the input/output (I/O) port 608 and the communication port 610, for communicating with other computing, network, or vehicle devices. It will be appreciated that the ports 608-610 may be combined or separate and that more or fewer ports may be included in the computer system 600.

The I/O port 608 may be connected to an I/O device, or other device, by which information is input to or output from the computing system 600. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 600 via the I/O port 608. The input devices can also convert signals generated by the electric vehicle 120 (e.g., the telematics device, motion sensors, cameras, etc.), the home devices 203, the power system devices, and so forth into input data via the I/O port 608. Similarly, the output devices may convert electrical signals received from computing system 600 via the I/O port 608 into signals that may be sensed as output by a human, such as sound, light, and/or touch. The input device may be an alphanumeric input device, including alphanumeric and other keys for communicating information and/or command selections to the processor 602 via the I/O port 608. The input device may be another type of user input device including, but not limited to: direction and selection control devices, such as a mouse, a trackball, cursor direction keys, a joystick, and/or a wheel; one or more sensors, such as a camera, a microphone, a positional sensor, an orientation sensor, a gravitational sensor, an inertial sensor, and/or an accelerometer; and/or a touch-sensitive display screen ("touchscreen"). The output devices may include, without limitation, a display, a touchscreen, a speaker, a tactile and/or haptic output device, and/or the like. In some implementations, the input device and the output device may be the same device, for example, in the case of a touchscreen.

The environment transducer devices convert one form of energy or signal into another for input into or output from the computing system 600 via the I/O port 608. For example, an electrical signal generated within the computing system 600 may be converted to another type of signal, and/or vice-versa. In one implementation, the environment transducer devices sense characteristics or aspects of an environment local to or remote from the computing device 600, such as, light, sound, temperature, pressure, magnetic field, electric field, chemical properties, physical movement, orientation, acceleration, gravity, and/or the like. Further, the environment transducer devices may generate signals to impose some effect on the environment either local to or remote from the example computing device 600, such as, physical movement of some object (e.g., a mechanical actuator), heating or cooling of a substance, adding a chemical substance, and/or the like.

In one implementation, a communication port 610 is connected to a network by way of which the computer system 600 may receive network data useful in executing the methods and systems set out herein as well as transmitting information and network configuration changes determined thereby. Stated differently, the communication port 610 connects the computer system 600 to one or more communication interface devices configured to transmit and/or receive information between the computing system 600 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 610 to communicate one or more other machines, either directly over a point-to-point communication path, over a wide area network (WAN) (e.g., the Internet), over a local area network (LAN), over a cellular (e.g., third generation (3G) fourth generation (4G), or fifth generation (5G)) network, or over another communication means. Further, the communication port 610 may communicate with an antenna or other link for electromagnetic signal transmission and/or reception.

In an example implementation, greenhouse gas detection and control software and other modules and services may be embodied by instructions stored on the data storage devices 604 and/or the memory devices 606 and executed by the processor 602.

In the present disclosure, the methods disclosed may be implemented as sets of instructions or software readable by a device. Further, it is understood that the specific order or hierarchy of steps in the methods disclosed are instances of example approaches. Based upon design preferences, it is understood that the specific order or hierarchy of steps in the method can be rearranged while remaining within the disclosed subject matter.

Referring to FIG. 7, example operations of a method 700 for monitoring and controlling a greenhouse gas output (e.g., "carbon footprint") are depicted. The method 700 shown in FIG. 7 can be performed by any of the systems depicted in FIGS. 1-6.

In some examples, at operation 702, the method 700 can identify, using non-transitory storage media storing computer-readable instructions executable by one or more processor, one or more device identifiers corresponding to one or more devices associated with a user. At operation 704, the method 700 can store the one or more device identifiers in one or more databases. At operation 706, the method 700 can receive, using the one or more processor accessing the one or more device identifiers, energy consumption-related data from the one or more devices resulting from an energy consumption behavior of the user. At operation 708, the method 700 can determine, using the one or more processor and the energy consumption-related data, one or more behavior metrics indicative of the energy consumption behavior of the user. At operation 710, the method 700 can identify, using a policy rule crawler, an energy consumption reduction integration corresponding to the one or more behavior metrics. At operation 712, the method 700 can integrate, using the one or more processor, the energy consumption reduction integration into a user profile associated with the user to facilitate a reduction of energy consumption for the user.

It is to be understood that the specific order or hierarchy of steps in the method(s) depicted throughout this disclosure are instances of example approaches and can be rearranged while remaining within the disclosed subject matter. For instance, any of the operations depicted throughout this disclosure may be omitted, repeated, performed in parallel, performed in a different order, and/or combined with any other of the operations depicted throughout this disclosure.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method for detecting and controlling a greenhouse gas output for a particular user, the method comprising:

establishing a wireless connection between one or more processors of a server and a plurality of devices associated with the user wherein the plurality of devices includes at least one of an onboard computing device of an electric vehicle, a home appliance, and a power system device;

receiving a device-specific identifier and energy consumption-related data from the plurality of devices via the wireless network connection;

determining, using the energy consumption-related data associated with the user, one or more behavior metrics indicative of an energy consumption behavior of the user;

identifying, using a policy rule crawler that accesses a database of a third-party entity, an energy consumption reduction integration corresponding to the one or more behavior metrics;

causing an indication of the energy consumption reduction integration to be presented at a user interface of a computing device associated with the user;

receiving one or more user inputs at the user interface indicating an acceptance of the energy consumption reduction integration;

integrating the energy consumption reduction integration into a user profile associated with the user by sending, via the wireless connection, control instructions to one or more devices of the plurality of devices to modify at least one operational parameter that affects a functioning of the one or more devices of the plurality of devices to facilitate a reduction of energy consumption for the user; and determining an accuracy of a first portion of the energy consumption-related data by comparing the first portion of the energy consumption-related data to a second portion of the energy consumption-related data, wherein the first portion includes the one or more user inputs at the user interface and second portion includes data directly from the one or more devices of the plurality of devices.

2. The method of claim 1, further comprising:

calculating, using the energy consumption-related data, a plurality of score values from which a ranking value associated with the user, and corresponding to an aggregation of the energy consumption behavior, is determined.

3. The method of claim 2, wherein the plurality of score values includes at least one of:

a driving score value;

an electric vehicle usage score value; or a battery degradation value.

4. The method of claim 2, further comprising determining that the ranking value is above or below a predetermined threshold value, wherein identifying the energy consumption reduction integration is responsive to the ranking value being above or below the predetermined threshold value.

5. The method of claim 4, wherein the ranking value relates to usage of an electric vehicle, the energy consumption reduction integration is a credit, and integrating the energy consumption reduction integration into the user profile includes applying the credit to an account associated with the electric vehicle.

6. A computer-readable non-transitory memory device storing instructions that, when executed by a processor, performs operations comprising:

establishing a wireless connection between one or more processors of a server and a plurality of devices associated with the user, wherein the plurality of devices includes an onboard computing device of an electric vehicle, and at least one of a home appliance, or a power system device;

receiving a device-specific identifier and energy consumption-related data from the plurality of devices via the wireless network connection;

identifying one or more device identifiers corresponding to one or more devices associated with the user, at least one of the one or more device identifiers being an electric vehicle identifier;

receiving energy consumption-related data from the one or more devices resulting from one or more energy consumption behaviors of the user, the one or more energy consumption behaviors including at least a driving behavior;

determining, based on the energy consumption-related data, one or more behavior metrics;

identifying an energy consumption reduction integration corresponding to the one or more behavior metrics;

causing an indication of the energy consumption reduction integration to be presented at a user interface of a computing device associated with the user;

receiving a user input at the user interface indicating an acceptance of the energy consumption reduction integration;

integrating, at least partly responsive to the user input, the energy consumption reduction integration into a user profile associated with the user by sending control instructions to the plurality of devices to modify at least one operational parameter that affects a functioning of the one or more devices of the plurality of devices to facilitate a reduction of energy consumption for the user; and determining an accuracy of a first portion of the energy consumption-related data by comparing the first portion of the energy consumption-related data to a second portion of the energy-related data, wherein the first portion includes the one or more user inputs at the user interface and the second portion includes data directly from the one or more devices of the plurality of devices.

7. The computer-readable non-transitory memory device of claim 6, wherein determining the one or more behavior metrics includes calculating an amount of time of electric vehicle usage.

8. The computer-readable non-transitory memory device of claim 6, wherein the instructions, when executed by the processor, performs operations including calculating, based on the energy consumption-related data, a battery degradation rate for an electric vehicle, wherein the energy consumption reduction integration includes a battery replacement program.

9. The computer-readable non-transitory memory device of claim 6, wherein the instructions, when executed by the processor, performs operations including:

receiving a plurality of energy consumption-related data from a plurality of users;

calculating a plurality of scores based on the plurality of energy consumption-related data; and causing a ranking, associated with the user and based on a comparison to the plurality of scores, to be presented at a mobile device of the user.

10. The computer-readable non-transitory memory device of claim 6, wherein the instructions, when executed by the processor, performs operations including:

receiving a plurality of energy consumption-related data from a plurality of users;

determining a battery charging pattern based on the plurality of energy consumption-related data; and causing an indication of the battery charging pattern to be presented at a computing device associated with the user.

11. The computer-readable non-transitory memory device of claim 10, wherein the indication of the battery charging pattern includes an indication of an optimal charging time.

12. The computer-readable non-transitory memory device of claim 10, wherein the indication of the battery charging pattern includes an indication of an available battery charger.

13. A system of greenhouse gas detection and control, the system comprising:

a device detection system configured to identify a device identifier corresponding to each device of a plurality of devices associated with a user by establishing a wireless connection between one or more processors of a server and an onboard computing device of an electric vehicle, and at least one of a home appliance or a power system device, wherein at least one of the device identifiers being an electric vehicle identifier;

a user behavior analyzer configured to:

receive energy consumption-related data from the plurality of devices resulting from energy consumption behavior of the user, and determine, based on the energy consumption-related data, one or more behavior metrics; and a reduction integration generator configured to:

identify an energy consumption reduction integration corresponding to the one or more behavior metrics;

cause an indication of the energy consumption reduction integration to be presented at a user interface of a computing device associated with a user;

receive one or more user inputs at the user interface indicating an acceptance of the energy consumption reduction integration;

integrate, at least partly responsive to the one or more user inputs, the energy consumption reduction integration into a user profile associated with the user, to facilitate a reduction of energy consumption for the user, wherein the reduction integration generator includes a device control system that sends an instruction to the one or more devices of the plurality of devices to cause a device operational parameter modification that affects ta functioning of the one or more devices of the plurality of devices to facilitate a reduction of energy consumption for the user, wherein the user behavior analyzer receives at least a first portion of the energy consumption-related data as the one or more user inputs at the user interface, and a second portion of the energy consumption-related data directly from the one or more devices, and the system further comprises:

a consumption verification tool which determines an accuracy of the first portion of the energy consumption-related data by comparing the first portion of the energy consumption-related data to the second portion of the energy consumption-related data.

14. The system of claim 13, wherein the user behavior analyzer comprises:

a driving behavior assessment tool which calculates, based on the energy consumption-related data, an electric vehicle driving score; or a home energy consumption tool which calculates, based on the energy consumption-related data, a home device usage score, wherein the electric vehicle driving score or the home device usage score is used by the reduction integration generator to identify the energy consumption reduction integration.

15. The system of claim 13, wherein the reduction integration generator comprises:

a policy rule crawler which accesses a plurality of databases of third-party entities to identify rebate or incentive programs related to energy consumption reduction, the energy consumption reduction integration being based on the rebate or incentive programs.

\* \* \* \* \*